US012283607B2

(12) United States Patent
Kim et al.

(10) Patent No.: US 12,283,607 B2
(45) Date of Patent: Apr. 22, 2025

(54) 3D INDUCTOR DESIGN USING BUNDLE SUBSTRATE VIAS

(71) Applicant: QUALCOMM Incorporated, San Diego, CA (US)

(72) Inventors: Jonghae Kim, San Diego, CA (US); Je-Hsiung Lan, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 617 days.

(21) Appl. No.: 17/349,724

(22) Filed: Jun. 16, 2021

(65) Prior Publication Data

US 2022/0406882 A1    Dec. 22, 2022

(51) Int. Cl.
| | | |
|---|---|---|
| *H01F 27/28* | (2006.01) | |
| *H01F 17/00* | (2006.01) | |
| *H01L 21/768* | (2006.01) | |
| *H01L 23/48* | (2006.01) | |
| *H01L 23/66* | (2006.01) | |
| *H01L 49/02* | (2006.01) | |
| *H01P 3/08* | (2006.01) | |
| *H01P 11/00* | (2006.01) | |

(52) U.S. Cl.
CPC ......... *H01L 28/10* (2013.01); *H01F 17/0006* (2013.01); *H01F 27/2804* (2013.01); *H01L 21/76898* (2013.01); *H01L 23/481* (2013.01); *H01L 23/66* (2013.01); *H01P 3/08* (2013.01); *H01P 11/003* (2013.01); *H01F 2017/004* (2013.01); *H01L 2223/6627* (2013.01); *H01L 2223/6672* (2013.01)

(58) Field of Classification Search
CPC ............. H01F 17/0006; H01F 27/2804; H01F 2017/004; H01F 2017/002; H01F 2017/0073; H01L 28/10; H01L 23/645; H01L 2225/06541–06544; H01L 23/481; H01L 23/5226
See application file for complete search history.

(56) References Cited

U.S. PATENT DOCUMENTS

| | | | |
|---|---|---|---|
| 10,756,004 B1* | 8/2020 | Elsherbini | H10N 60/815 |
| 2007/0268105 A1* | 11/2007 | Walls | H01L 23/49822 |
| | | | 336/200 |
| 2017/0047155 A1* | 2/2017 | Yao | H01F 3/10 |
| 2017/0309700 A1 | 10/2017 | Duevel et al. | |
| 2018/0040547 A1 | 2/2018 | Zuo et al. | |
| 2018/0158775 A1* | 6/2018 | Leipold | H01F 5/003 |
| 2018/0233604 A1* | 8/2018 | Gu | H01L 29/20 |
| 2019/0305077 A1* | 10/2019 | Feng | H01L 23/5223 |
| 2019/0378640 A1* | 12/2019 | Cheng | H04B 1/18 |

OTHER PUBLICATIONS

International Search Report and Written Opinion—PCT/US2022/026567—ISA/EPO—Aug. 4, 2022.

* cited by examiner

*Primary Examiner* — Mang Tin Bik Lian
(74) *Attorney, Agent, or Firm* — Seyfarth Shaw LLP

(57) ABSTRACT

A three dimensional (3D) inductor is described. The 3D inductor includes a first plurality of micro-through substrate vias (TSVs) within a first area of a substrate. The 3D inductor also includes a first trace on a first surface of the substrate, coupled to a first end of the first plurality of micro-TSVs. The 3D inductor further includes a second trace on a second surface of the substrate, opposite the first surface, coupled to a second end, opposite the first end, of the first plurality of micro-TSVs.

10 Claims, 11 Drawing Sheets

3D INDUCTOR DESIGN USING BUNDLE SUBSTRATE VIAS

BACKGROUND

Field

Aspects of the present disclosure relate to semiconductor devices and, more particularly, to a 3D solenoid inductor design using bundle substrate vias.

Background

Wireless communications devices incorporate radio frequency (RF) modules that facilitate the communication and features users expect. As wireless systems become more prevalent and include more capabilities, the chips have become more complex to produce. Fifth generation (5G) new radio (NR) wireless communications devices incorporate the latest generation of electronic dies that pack many features and devices into modules that are smaller and with increasingly smaller interconnections. As these modules increase in density, inductors are important for performance and may occupy significant areas on the die.

Design challenges for mobile radio frequency (RF) chips, such as mobile RF transceivers, include analog/RF performance considerations, including mismatch, noise and other performance considerations. The design of these mobile RF transceivers includes the use of passive devices, such as inductors for example, to suppress resonance, and/or to perform filtering, bypassing, and coupling. These inductors are integrated into high power, system on chip devices, such as application processors and graphics processors.

In practice, the passive devices of a mobile RF transceiver may involve high performance inductor components. For example, analog integrated circuits use various types of passive devices, such as integrated inductors. The use of integrated inductors may consume significant area on a laminate or package substrate and may also result in higher insertion loss and lower quality (Q)-factors. It is desirable to improve the performance of integrated inductors to provide a higher Q-factor. The integrated inductors may be used for millimeter wave (mmW) filters in 5G NR RF modules.

SUMMARY

A three dimensional (3D) inductor is described. The 3D inductor includes a first plurality of micro-through substrate vias (TSVs) within a first area of a substrate. The 3D inductor also includes a first trace on a first surface of the substrate, coupled to a first end of the first plurality of micro-TSVs. The 3D inductor further includes a second trace on a second surface of the substrate, opposite the first surface, coupled to a second end, opposite the first end, of the first plurality of micro-TSVs.

A method for fabricating a three dimensional (3D) inductor is described. The method includes forming a first plurality of micro-through substrate vias (TSVs) within a first area of a substrate. The method also includes depositing a first trace on a first surface of the substrate to contact a first end of the first plurality of micro-TSVs. The method further includes depositing a second trace on a second surface of the substrate, opposite the first surface, to contact a second end, opposite the first end of the first plurality of micro-TSVs.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
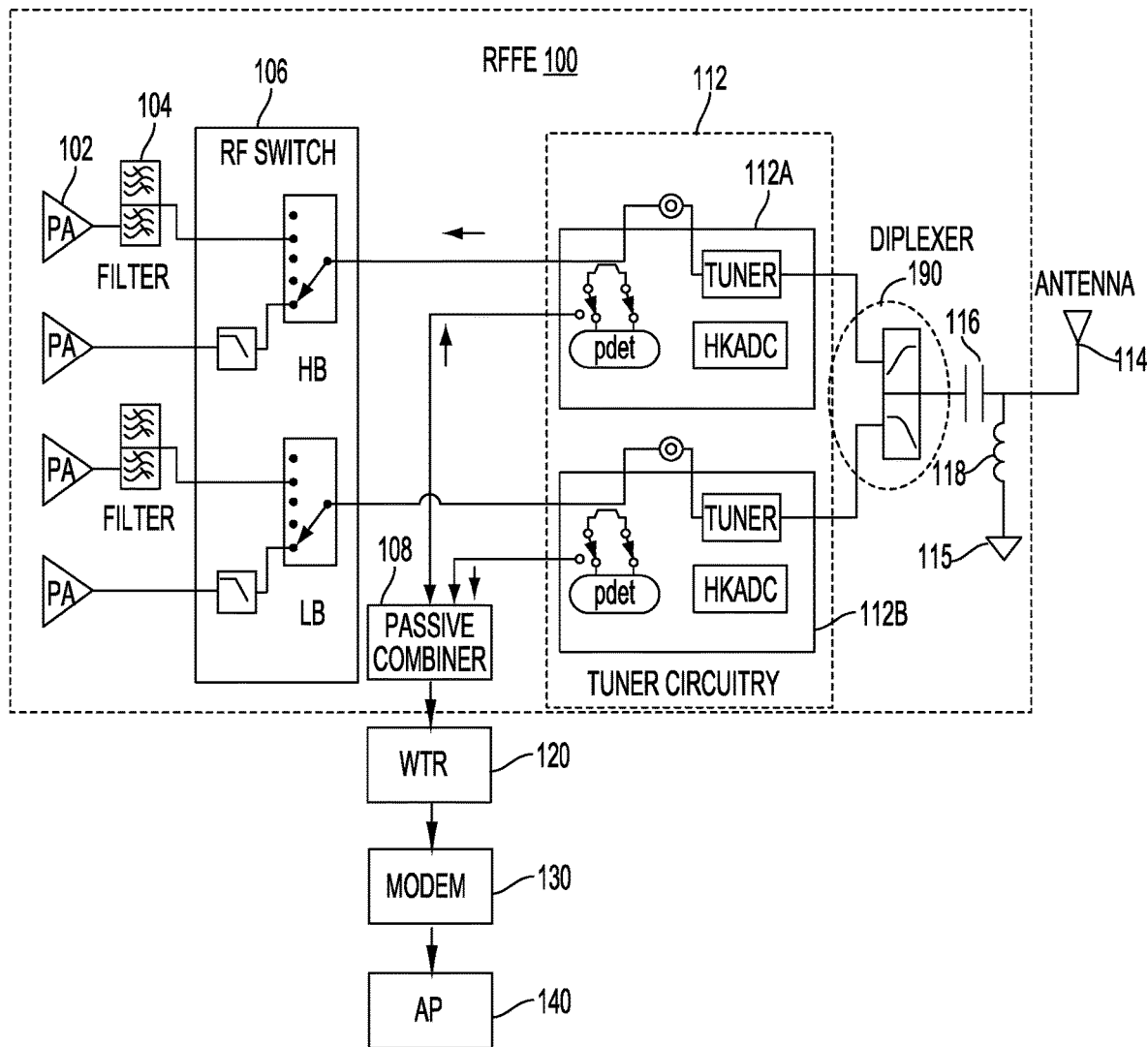
FIG. 1 is a schematic diagram of a radio frequency front-end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers is complicated by added circuit functions for supporting communication enhancements, such as fifth generation (5G) new radio (NR) communications systems. Further design challenges for mobile RF transceivers include using passive devices, which directly affect analog RF performance considerations, including mismatch, noise, and other performance considerations.

Passive devices in mobile radio frequency (RF) transceivers may include high performance inductor components. For example, analog integrated circuits use various types of passive devices, such as integrated inductors. An inductor is an example of an electrical device used to temporarily store energy in a magnetic field within a wire coil according to an inductance value. This inductance value provides a measure of the ratio of voltage to the rate of change of current passing through the inductor. When the current flowing through an inductor changes, energy is temporarily stored in a magnetic field in the coil. In addition to their magnetic field storing capability, inductors are often used in alternating current (AC) electronic equipment, such as radio equipment. For example, the design of mobile RF transceivers includes the use of inductors with improved inductance density while reducing magnetic loss at 5G NR FRI frequencies (e.g., frequency range one (FR1)).

A radio frequency front-end (RFFE) module may include a 5G broadband FR1 filter including capacitors and inductors. Unfortunately, integrated inductors within the 5G broadband FR1 filter may suffer from a degraded quality (Q)-factor. In addition, the degraded quality Q-factor of the integrated inductors may cause insertion loss within the 5G broadband FR1 filter. During operation of the 5G NR broadband FR1 filter, an increased Q-factor of the inductors may significantly improve the insertion loss of the filter. While the inductors may be formed using a solenoid type of inductor composed of back-end-of-line (BEOL) metallization layers, a magnetic linkage of the inductors is reduced, which further degrades the Q-factor.

Various aspects of the present disclosure provide a 3D inductor design using bundle substrate vias. The process flow for fabrication of the 3D inductor using bundle substrate vias may include front-end-of-line (FEOL) processes, middle-of-line (MOL) processes, and back-end-of-line (BEOL) processes. It will be understood that the term "layer" includes film and is not construed as indicating a vertical or horizontal thickness unless otherwise stated. As described, the term "substrate" may refer to a substrate of a diced wafer or may refer to a substrate of a wafer that is not diced. Similarly, the terms "chip" and "die" may be used interchangeably.

As described, the back-end-of-line (BEOL) interconnect layers may refer to the conductive interconnect layers (e.g., a first interconnect layer (M1) or metal one M1, metal two (M2), metal three (M3), metal four (M4), etc.) for electrically coupling to front-end-of-line (FEOL) active devices of an integrated circuit. The various BEOL interconnect layers are formed at corresponding BEOL interconnect layers, in which lower BEOL interconnect layers use thinner metal layers relative to upper BEOL interconnect levels. The BEOL interconnect layers may electrically couple to middle-of-line (MOL) interconnect layers, for example, to connect M1 to an oxide diffusion (OD) layer of an integrated circuit. The MOL interconnect layer may include a zero interconnect layer (M0) for connecting M1 to an active device layer of an integrated circuit. A BEOL first via (V2) may connect M2 to M3 or others of the BEOL interconnect layers.

According to aspects of the present disclosure, a 3D inductor design is implemented using a bundle of micro-through substrate vias (TSVs). As described, the term "bundle of micro-TSVs" may refer to a group (e.g., bundle) of micro-TSVs formed within an area of a substrate corresponding to form factor of a macro-TSV. As described, the form factor of a macro-TSV is sized to accommodate a plurality of micro-TSVs, in which the form factor of the macro-TSV is substantially greater than a form factor of a micro-TSV. In these aspects of the present disclosure, the 3D inductor may be composed of a first bundle of micro-TSVs within a first area of the substrate corresponding to a form factor of a macro-TSV, such as a first macro-TSV opening within the substrate. The 3D inductor also includes a first trace on a first surface of the substrate, coupled to the first bundle of micro-TSVs. The 3D inductor further includes a second trace on a second surface of the substrate, opposite the first surface. In these aspects of the present disclosure, the second trace is coupled to opposite ends of the first bundle of micro-TSVs, in which a space between two of the first micro-TSVs of the first bundle of micro-TSVs is less than a space between the first area of the substrate and a second area of the substrate corresponding to the form factor of the macro-TSV.

In aspects of the present disclosure, a radio frequency front-end (RFFE) module includes filters configured with 3D inductors having a bundle of micro-TSVs. Aspects of the present disclosure improve the Q-factor of inductors within broadband filters by implementing a bundle of micro-TSVs to provide a special design for 5G NR broadband FR1 filters. The increased Q-factor provided by the bundle of micro-TSVs within the 3D inductors significantly improves insertion loss performance of the broadband filter. In some aspects of the present disclosure, the bundle of micro-TSVs increases magnetic linkage of the 3D inductors to improve the Q-factor.

FIG. 1 is a schematic diagram of a radio frequency front-end (RFFE) module 100 employing passive devices including an inductor 118 (e.g., a 3D inductor having a bundle of micro-TSVs). The RFFE module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RFFE module 100.

The radio frequency front-end (RFFE) module 100 also includes tuner circuitry 112 (e.g., first tuner circuitry 112A and second tuner circuitry 112B), the diplexer 190, the capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a housekeeping analog to digital converter (HKADC). The tuner circuitry 112 may perform impedance tuning (e.g., a voltage standing wave ratio (VSWR) optimization) for the antenna 114. The RFFE module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 190 is between the tuner component of the tuner circuitry 112 and the capacitor 116, the inductor 118 (e.g., a 3D inductor having a bundle of micro-TSVs), and the antenna 114. The diplexer 190 may be placed between the antenna 114 and the tuner circuitry 112 to provide high system performance from the radio frequency front-end (RFFE) module 100 to a chipset including the wireless transceiver 120, the modem 130, and the application processor 140. The diplexer 190 also performs frequency domain multiplexing on both high band frequencies and low band frequencies. After the diplexer 190 performs its frequency multiplexing functions on the input signals, the output of the diplexer 190 is fed to an optional inductor/capacitor (LC) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
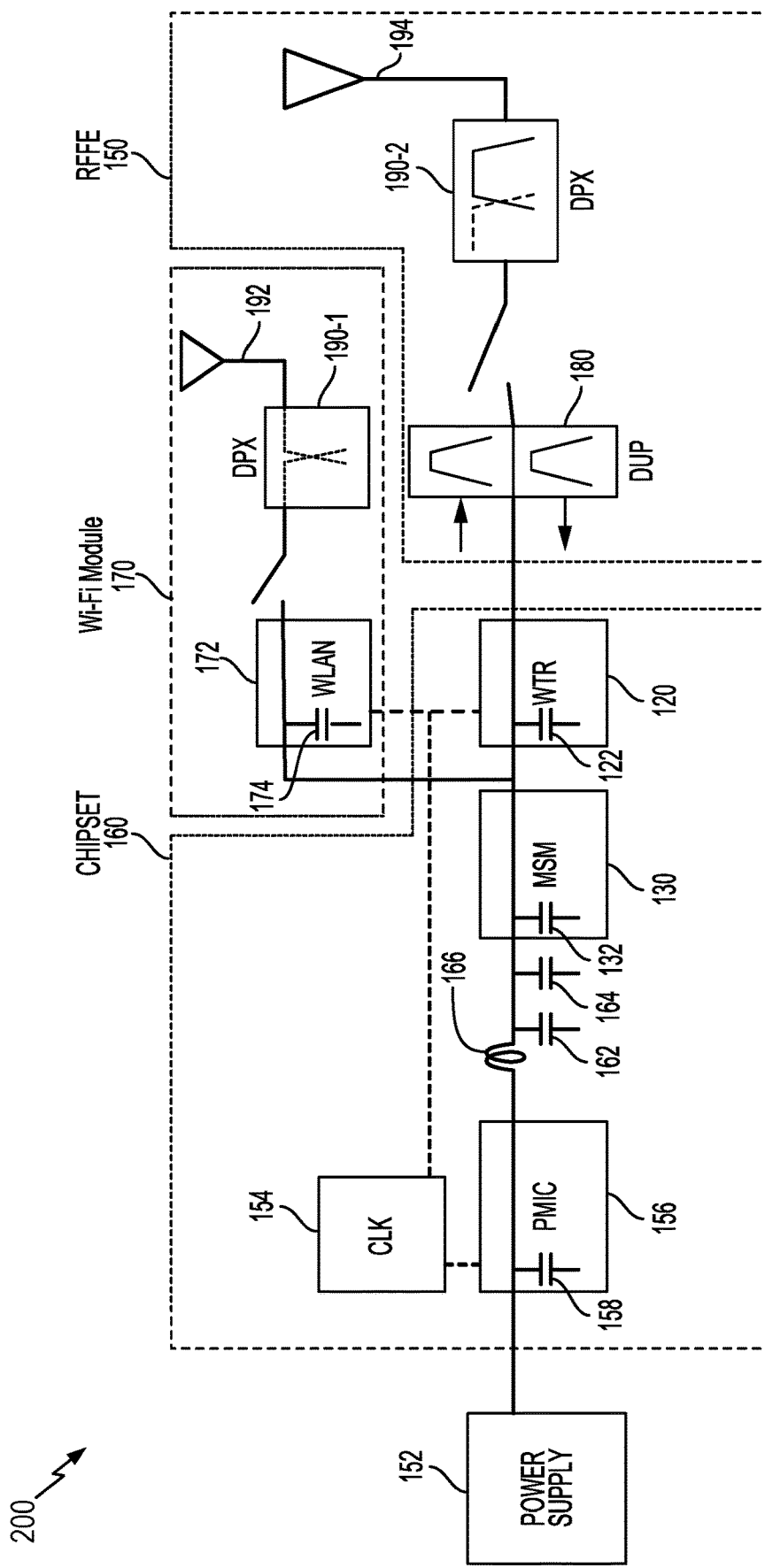
FIG. 2 is a schematic diagram of a radio frequency front-end (RFFE) module employing passive devices for a chipset.

FIG. 2 is a schematic diagram of a radio frequency integrated circuit (RFIC) chip 200, having a wireless local area network (WLAN) (e.g., Wi-Fi) module 170 including a first diplexer 190-1 and a radio frequency front-end (RFFE) module 150 including a second diplexer 190-2 for a chipset 160), including 3D inductors having a bundle of micro-TSVs. The Wi-Fi module 170 includes the first diplexer 190-1 communicably coupling an antenna 192 to a wireless local area network module (e.g., WLAN module 172). The RFFE module 150 includes the second diplexer 190-2 communicably coupling an antenna 194 to a wireless transceiver (WTR) 120 through a duplexer 180. The wireless transceiver 120 and the WLAN module 172 of the Wi-Fi module 170 are coupled to a modem (mobile station modem (MSM), e.g., baseband modem) 130 that is powered by a power supply 152 through a power management integrated circuit (PMIC) 156. The chipset 160 also includes capacitors 162 and 164, as well as an inductor(s) 166 to provide signal integrity.

The power management integrated circuit (PMIC) 156, the modem 130, the wireless transceiver 120, and the wireless local area network (WLAN) module 172 each include capacitors (e.g., 158, 132, 122, and 174) and operate according to a clock 154. In addition, the inductor 166 couples the modem 130 to the PMIC 156. The design of the radio frequency integrated circuit (RFIC) chip 200 includes 3D inductors having a bundle of micro-TSVs, according to aspects of the present disclosure.

Figure 3:
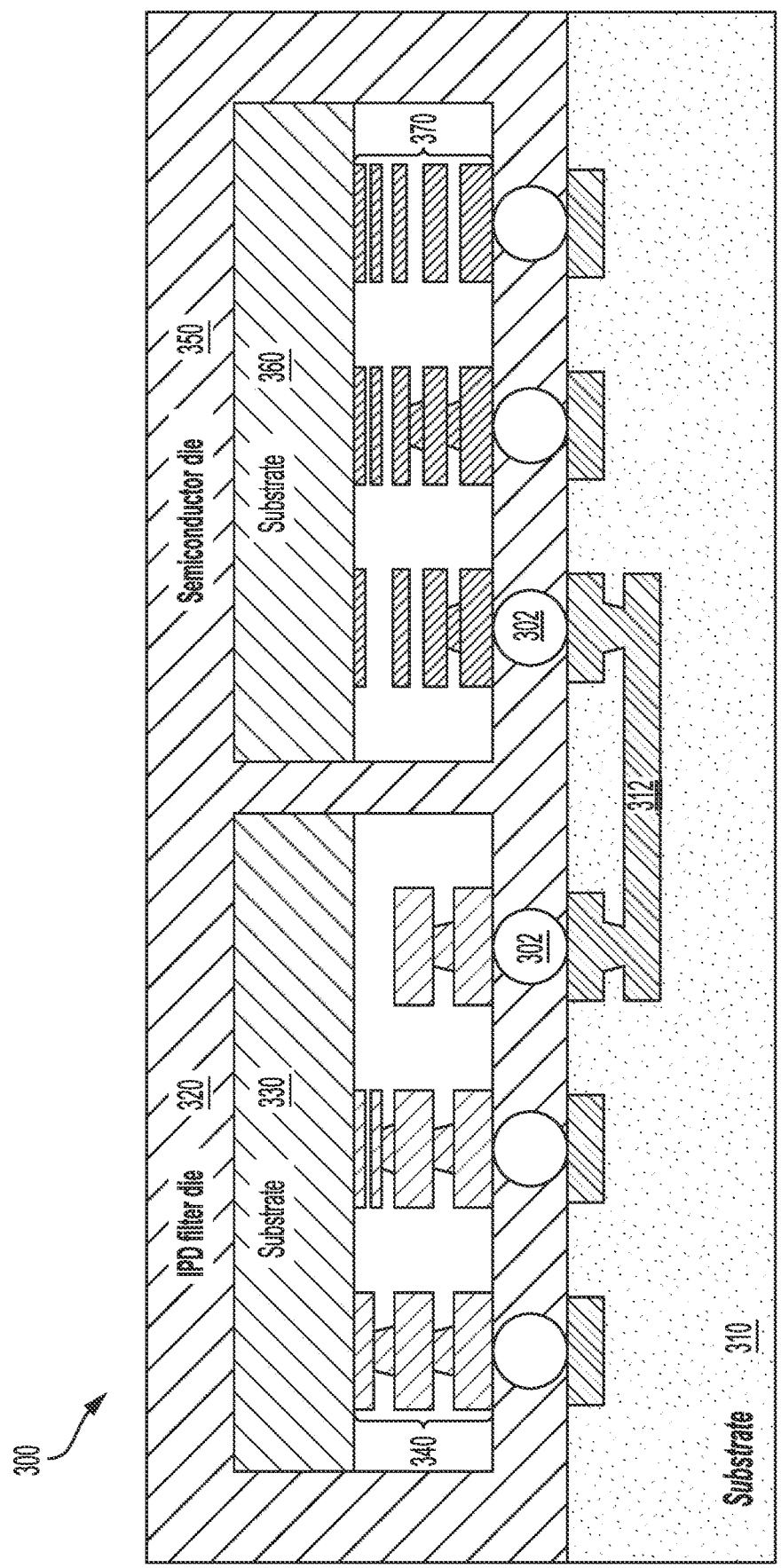
FIG. 3 is a block diagram illustrating a cross-sectional view of a radio frequency front-end (RFFE) module including a semiconductor die and an integrated passive device (IPD) filter die, in accordance with aspects of the present disclosure.

FIG. 3 is a block diagram illustrating a cross-sectional view of a radio frequency front-end (RFFE) module 300 including a semiconductor die and an integrated passive device (IPD) filter die, in accordance with aspects of the present disclosure. In this example, the RFFE module 300 includes a semiconductor die 350 and an integrated passive device (IPD) filter die 320 supported by a substrate 310. The semiconductor die 350 may be an active die having a semiconductor substrate 360 (e.g., an active silicon substrate) coupled to package balls 302 through back-end-of-line (BEOL) layers 370. The BEOL layers 370 include multiple BEOL metallization layers (M1, M2, M3, . . . , Mn) on the semiconductor substrate 360 (e.g., a diced silicon wafer). A redistribution layer 312 is coupled to the package balls 302.

The IPD filter die 320 includes a substrate 330 (e.g., a passive substrate) coupled to the package balls 302 through back-end-of-line (BEOL) layers 340. The redistribution layer 312 is coupled to the IPD filter die 320 through the package balls 302. In some aspects of the present disclosure, the substrate 330 is composed of glass, and the IPD filter die 320 is a glass-substrate integrated passive device (GIPD) filter die. The IPD filter die 320 may implement a 5G NR broadband FR1 filter. According to aspects of the present disclosure, the IPD filter die 320 includes 3D inductors having a bundle of micro-TSVs, as shown in FIGS. 4A and 4B.

Figure 4A:
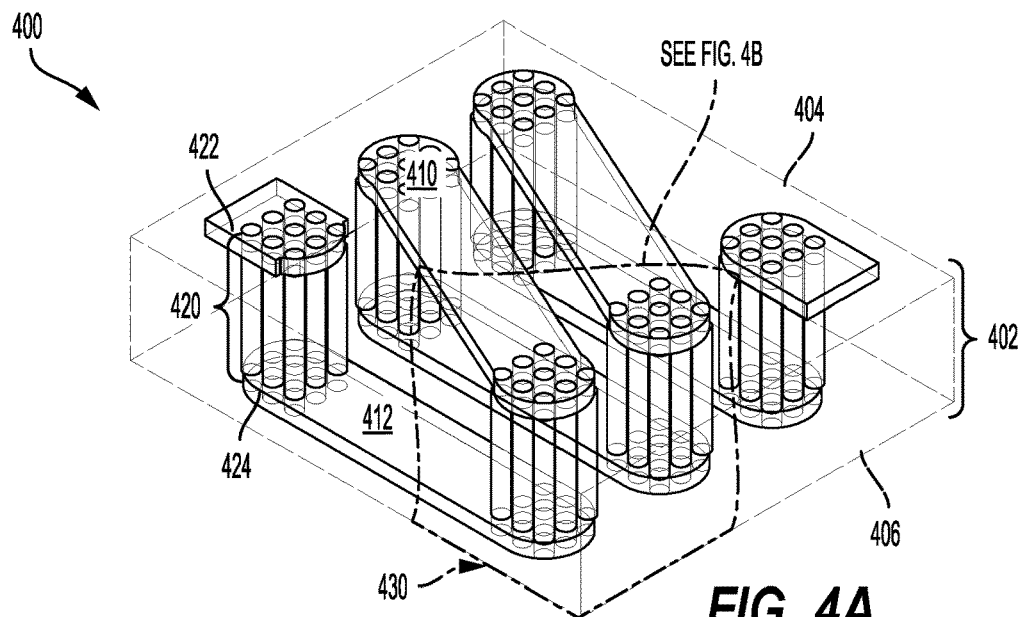
FIGS. 4A and 4B are block diagrams illustrating a perspective view and an exploded view of a 3D inductor implemented using a bundle of micro-through substrate vias (TSVs) within a substrate, according to aspects of the present disclosure.
Figure 4B:
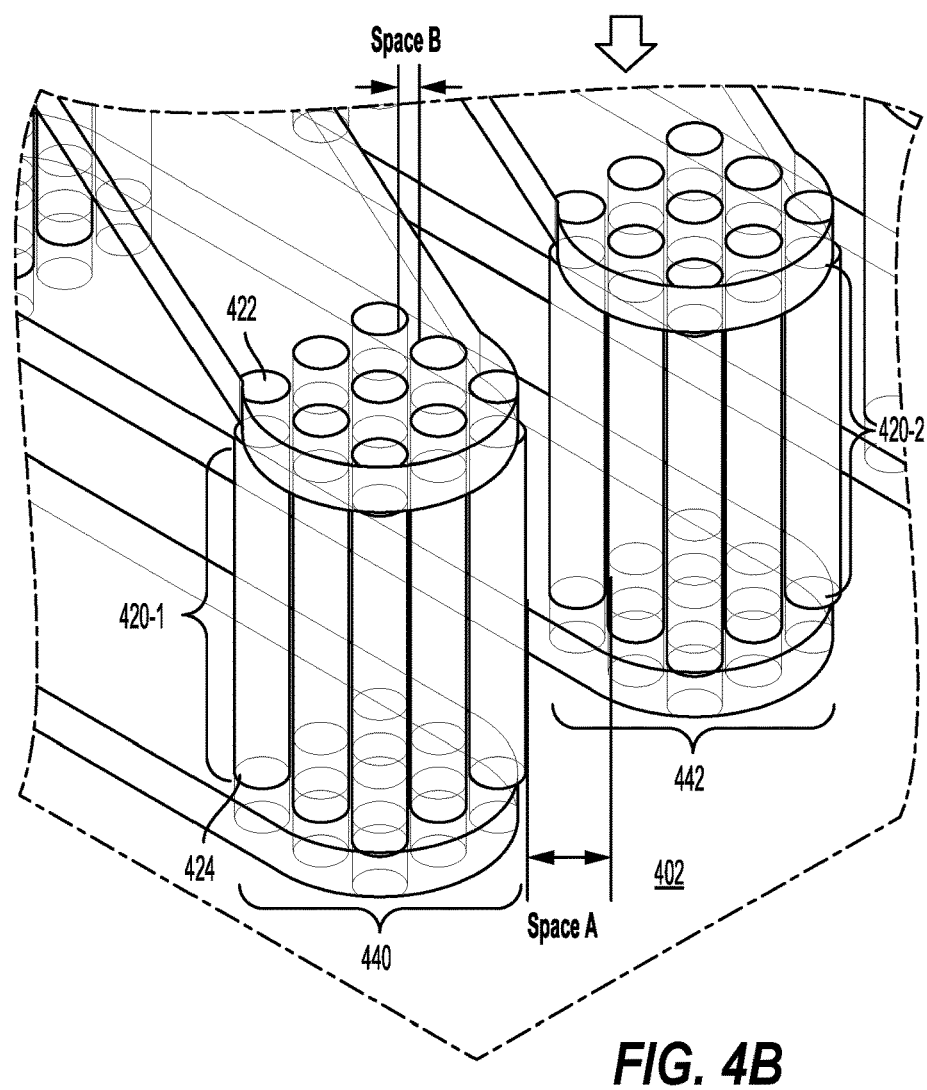

FIGS. 4A and 4B are block diagrams illustrating a perspective view and an exploded view of a 3D inductor implemented using a bundle of micro-through substrate vias (TSVs) within a substrate, according to aspects of the present disclosure. FIG. 4A illustrates a perspective view of a 3D inductor 400 having a bundle of micro-TSVs 420 formed in a substrate 402, in accordance with aspects of the present disclosure. For example, the 3D inductor 400 includes a first trace 410 on a first surface 404 of the substrate 402 and contacted to a first end 422 of the bundle of micro-TSVs 420. The 3D inductor 400 also includes a second trace 412 on a second surface 406, opposite the first surface 404, of the substrate 402 and contacted to a second end 424 of the bundle of micro-TSVs 420. A highlighted portion 430 of the 3D inductor 400 is further illustrated in FIG. 4B.

FIG. 4B is a block diagram illustrating an exploded view of the 3D inductor 400 including the bundle of micro-TSVs of FIG. 4A, according to aspects of the present disclosure. In this example, a Space A between the first bundle of micro-TSVs 420-1 and the second bundle of micro-TSVs 420-2 is shown. In addition, a Space B between the individual micro-TSVs of the first bundle of micro-TSVs 420-1 is also shown. In this example, the first bundle of micro-TSVs 420-1 is formed within a first macro-TSV opening 440 within the substrate 402. In these aspects of the present disclosure, the Space B between the micro-TSVs of the first bundle of micro-TSVs 420-1 is less than a space between the first macro-TSV opening 440 and a second macro-TSV opening 442 in the substrate 402. In these aspects of the present disclosure, the first macro-TSV opening 440 corresponding to a first area of the substrate having a form factor of a macro-TSV. In addition, the second macro-TSV opening 442 in the substrate 402 corresponding to a second area of the substrate having the form factor of the macro-TSV.

In practice, a form factor of the first macro-TSV opening 440 and the second macro-TSV opening 442 generally involve a diameter greater than eighty (80) micrometers (μm). This large form factor of the first macro-TSV opening 440 and the second macro-TSV opening 442 present process challenges during fabrication of these conventional macro-TSVs. These process challenges include violation of density rules, in which metal plating ratios used to form conventional macro-TSVs may lead to substrate warpage. In these aspects of the present disclosure, a reduced form factor of the individual micro-TSVs of the first bundle of micro-TSVs 420-1 has a diameter of less than twenty (20) micrometers (μm). The reduced form factor of the individual micro-TSVs of the first bundle of micro-TSVs 420-1 avoids the noted process challenges associated with conventional macro-TSVs, while reducing current leakage.

Furthermore, the Space A between the first bundle of micro-TSVs 420-1 and the second bundle of micro-TSVs 420-2 is reduced relative to a pitch of conventional macro-TSVs. The increased pitch between conventional macro-TSVs provides a low aspect ratio that leads to wasted space. In addition, an alternating current (AC) resistance of conventional macro-TSVs, which is governed by the skin effect, may become problematic at the high frequency at which broadband filters operate. Aspects of the present disclosure mitigate the noted process challenges, resulting in an improvement (e.g., 10%) of a Q-factor of the 3D inductor 400. This Q-factor improvement is achieved due to a tight design rule check (DRC), which may be defined as a design rule specification, such as metal to metal pitch/space to avoid violating a process-capability.

Figure 5A:
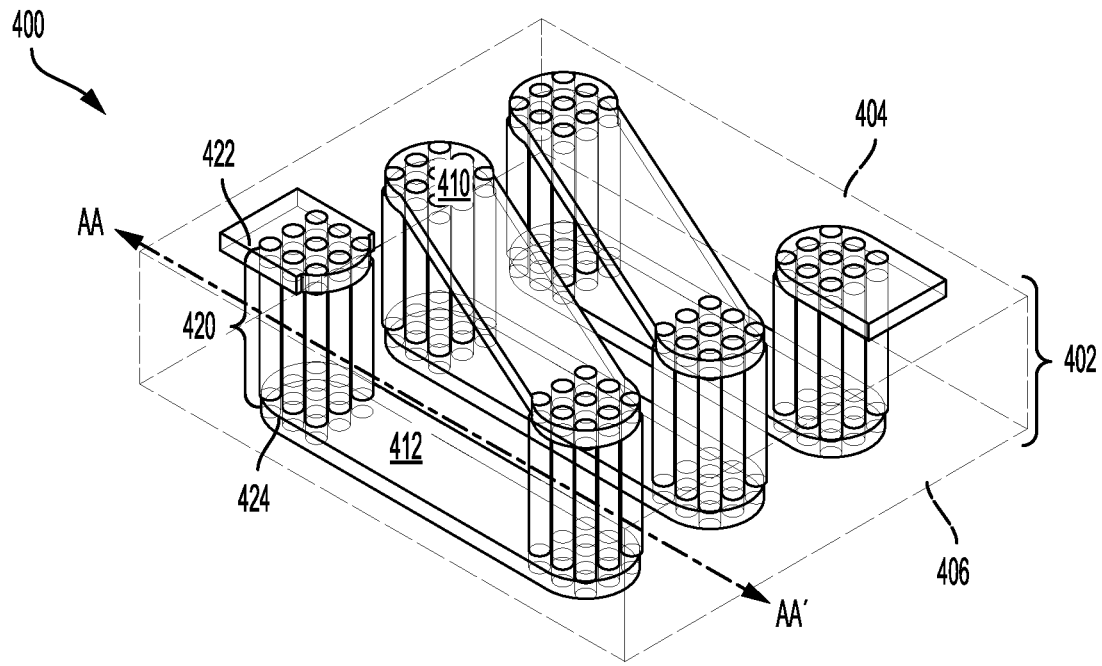
FIGS. 5A and 5B are block diagrams illustrating a perspective view and a cross-sectional view of the 3D inductor including the bundle of micro-through substrate vias (TSVs) of FIG. 4A, according to aspects of the present disclosure.
Figure 5B:
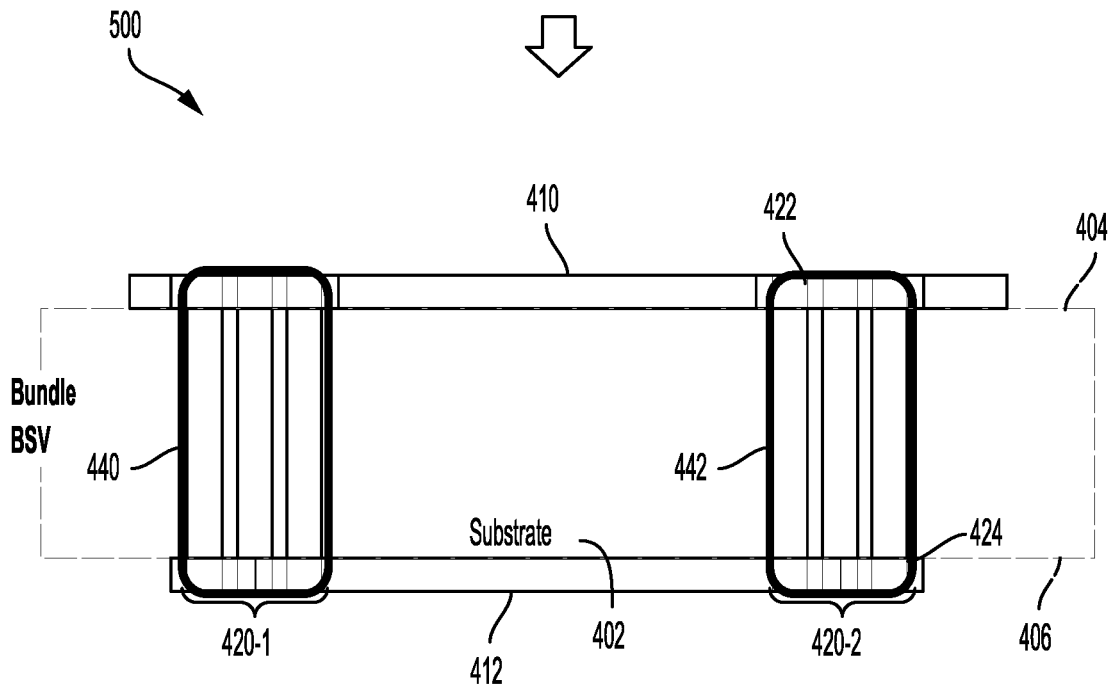

FIGS. 5A and 5B are block diagrams illustrating a perspective view and a cross-sectional view of the 3D inductor 400 including the bundle of micro-TSVs of FIG. 4A, according to aspects of the present disclosure. FIG. 5A illustrates the perspective view of the 3D inductor 400 having a bundle of micro-TSVs 420 formed in the substrate 402, in accordance with aspects of the present disclosure. A cross-sectional view along the line AA-AA' of the 3D inductor 400 is further illustrated in FIG. 5B.

FIG. 5B is a block diagram illustrating a cross-sectional view 500 of the 3D inductor 400 including the bundle of micro-TSVs 420 of FIG. 5A, according to aspects of the present disclosure. In this example, the first bundle of micro-TSVs 420-1 and the second bundle of micro-TSVs 420-2 are shown between the first trace 410 and the second trace 412 on the first surface 404 and the second surface 406 of the substrate 402. In this example, the first bundle of micro-TSVs 420-1 is formed within the first macro-TSV opening 440 within the substrate 402 to provide an improved aspect ratio. In addition, the second bundle of micro-TSVs 420-2 is formed within the second macro-TSV opening 442 within the substrate 402 to also provide an improved aspect ratio. In these aspects of the present disclosure, the first macro-TSV opening 440 and/or the second macro-TSV opening 442 is formed within a cylindrical TSV opening of the substrate 402.

Figure 6A:
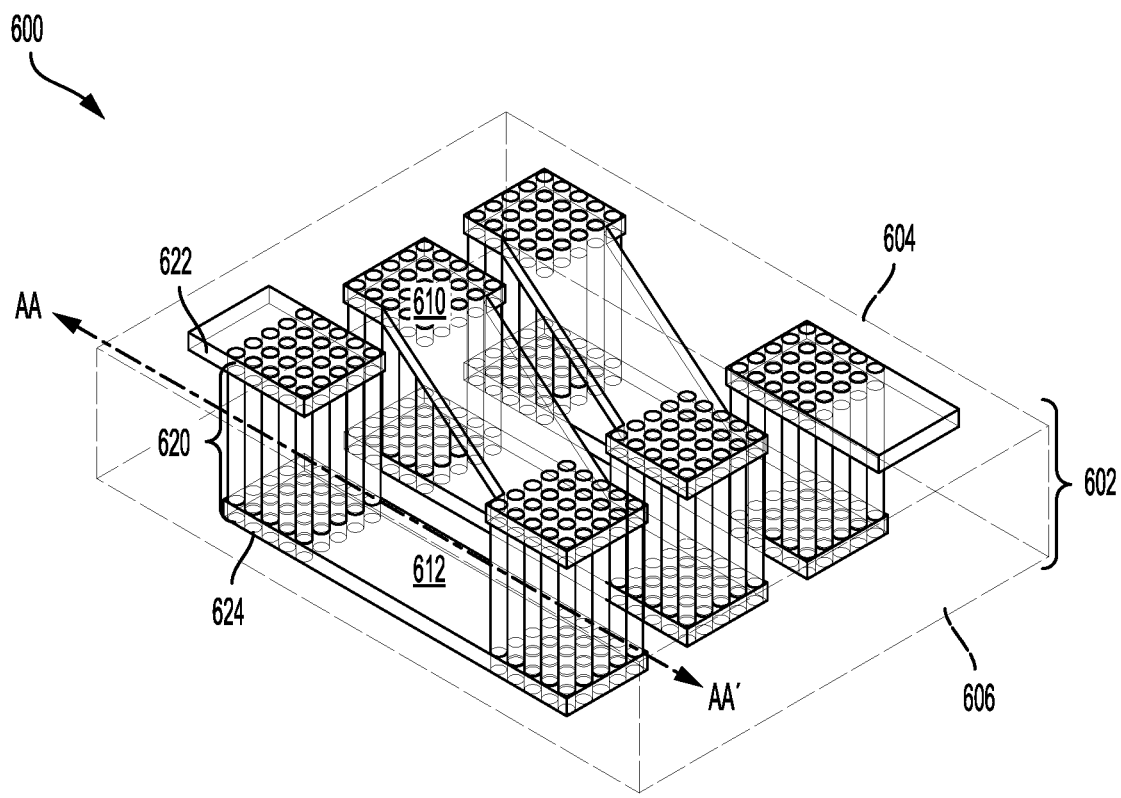
FIGS. 6A and 6B are block diagrams illustrating a perspective view and a cross-sectional view of a 3D inductor with a bundle of micro-through substrate vias (TSVs) formed within rectangular openings of a substrate, according to aspects of the present disclosure.
Figure 6B:
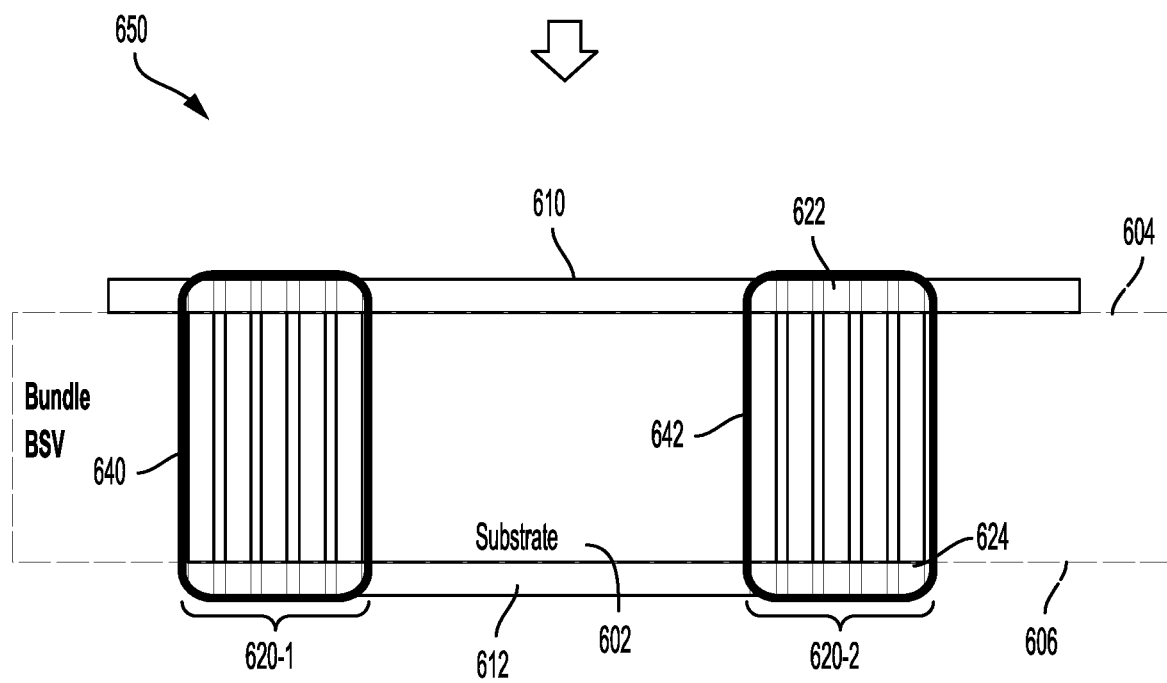

FIGS. 6A and 6B are block diagrams illustrating a perspective view and a cross-sectional view of a 3D inductor having a bundle of micro-TSVs formed within rectangular openings of a substrate, according to aspects of the present disclosure. FIG. 6A illustrates a perspective view of a 3D inductor 600 having a bundle of micro-TSVs 620 formed in rectangular openings of a substrate 602, in accordance with aspects of the present disclosure. For example, the 3D inductor 600 includes a first trace 610 on a first surface 604 of the substrate 602 and contacted to a first end 622 of the bundle of micro-TSVs 620. The 3D inductor 600 also includes a second trace 612 on a second surface 606, opposite the first surface 604, of the substrate 602 and contacted to a second end 624 of the bundle of micro-TSVs 620. A cross-sectional view along the line AA-AA' of the 3D inductor 600 is further illustrated in FIG. 6B.

FIG. 6B is a block diagram illustrating a cross-sectional view 650 of the 3D inductor 600 including the bundle of micro-TSVs 620 of FIG. 6A, according to aspects of the present disclosure. In this example, the first bundle of micro-TSVs 620-1 and the second bundle of micro-TSVs 620-2 are shown between the first trace 610 and the second trace 612 on the first surface 604 and the second surface 606 of the substrate 602. In this example, the first bundle of micro-TSVs 620-1 is formed within a first rectangular TSV opening 640 within the substrate 602 to provide an improved aspect ratio as well as an increased number of micro-TSVs. In addition, the second bundle of micro-TSVs 620-2 is formed within a second rectangular TSV opening 642 within the substrate 602 to also provide an improved aspect ratio as well as an increased number of micro-TSVs.

Figure 7A:
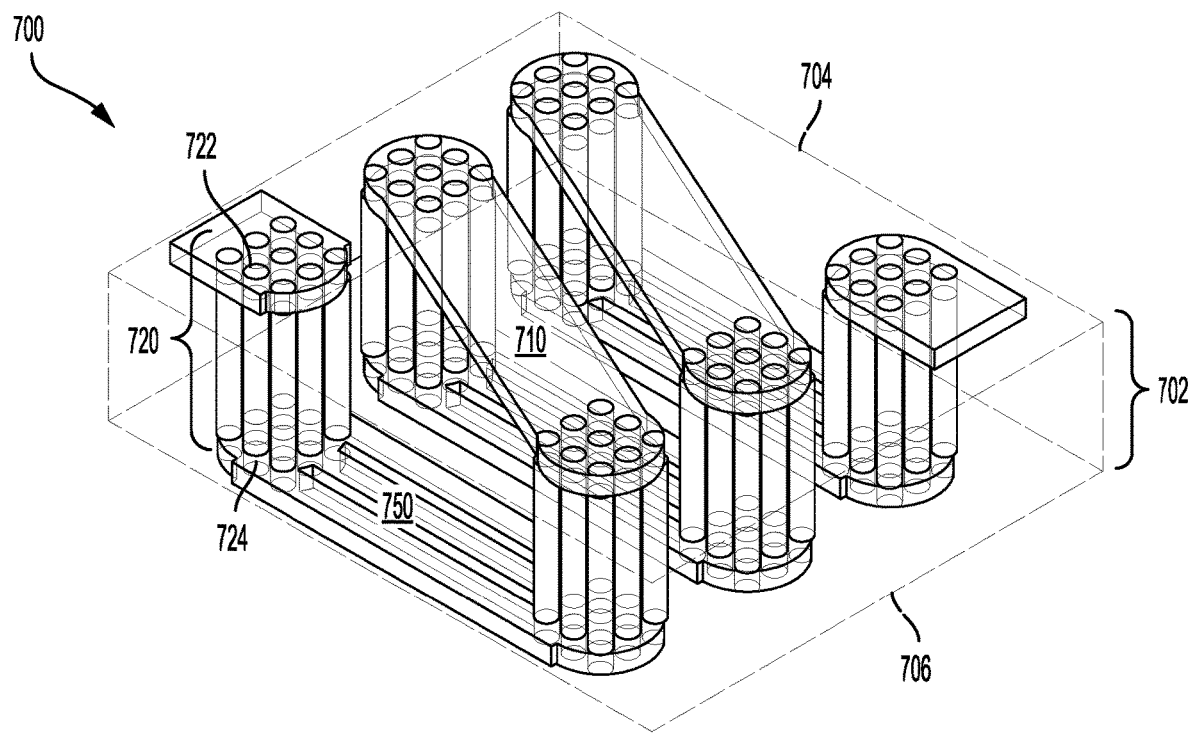
FIGS. 7A and 7B are block diagrams illustrating a perspective view of a 3D inductor implemented using a bundle of micro-through substrate vias (TSVs) within a substrate and multiple strip line traces, according to aspects of the present disclosure.
Figure 7B:
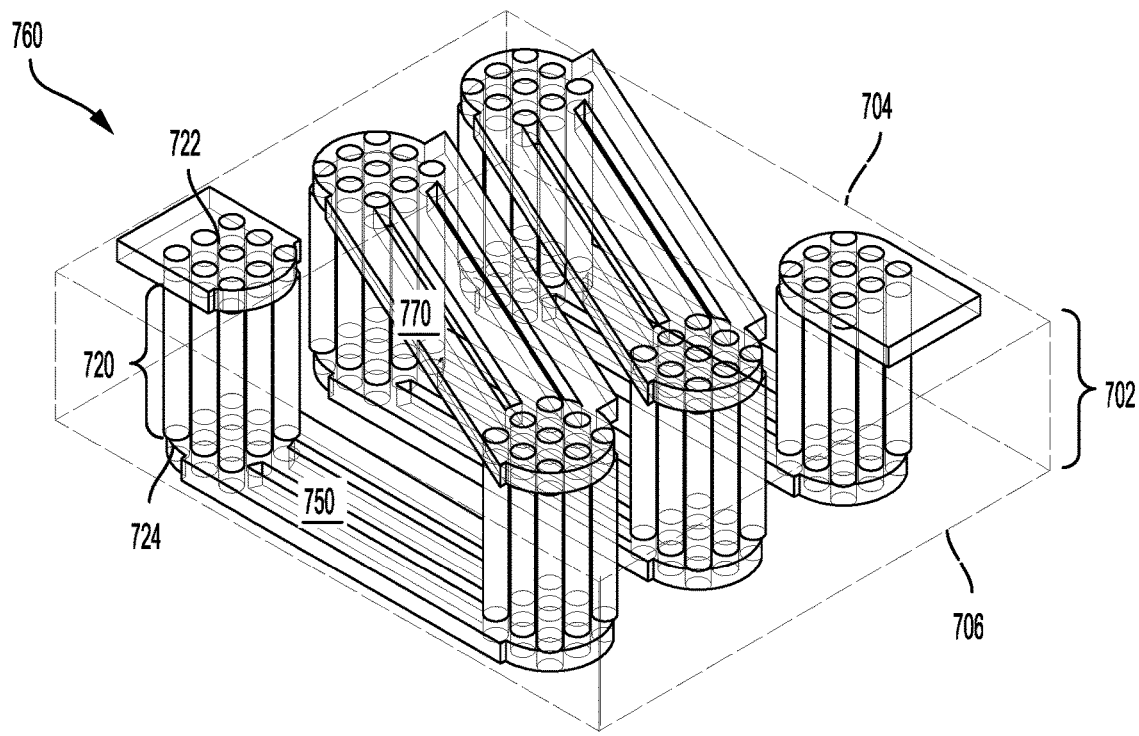

FIGS. 7A and 7B are block diagrams illustrating a perspective view of a 3D inductor implemented using a bundle of micro-through substrate vias (TSVs) within a substrate and multiple strip-line traces, according to aspects of the present disclosure. FIG. 7A illustrates a perspective view of a 3D inductor 700 having a bundle of micro-TSVs 720 formed in a substrate 702, in accordance with aspects of the present disclosure. For example, the 3D inductor 700 includes a first trace 710 (e.g., a single strip-line trace) on a first surface 704 of a substrate 702 and contacted to a first end 722 of the bundle of micro-TSVs 720. In these aspects of the present disclosure, the 3D inductor 700 also includes a first multiple strip-line trace 750 on a second surface 706, opposite the first surface 704, of the substrate 702 and contacted to a second end 724 of the bundle of micro-TSVs 720. The first multiple strip-line trace 750 on the second surface 706 of the substrate 702 helps increase a Q-factor of the 3D inductor 700 relative to the 3D inductor 400 shown in FIG. 4A.

FIG. 7B illustrates a perspective view of a 3D inductor 760 having a bundle of micro-TSVs 720 formed in the substrate 702, in accordance with aspects of the present disclosure. In these aspects of the present disclosure, the 3D inductor 760 includes a second multiple strip-line trace 770 on the first surface 704 of the substrate 702 and contacted to a first end 722 of the bundle of micro-TSVs 720. The 3D inductor 760 also includes the first multiple strip-line trace 750 on the second surface 706, opposite the first surface 704, of the substrate 702 and contacted to the second end 724 of the bundle of micro-TSVs 720. The first multiple strip-line trace 750 on the second surface 706 and the second multiple strip-line trace 770 on the second surface 706 of the substrate 702 further increase a Q-factor of the 3D inductor 760 relative to the 3D inductor 700 shown in FIG. 7A, as further illustrated in FIGS. 8A-8C.

Figure 8A:
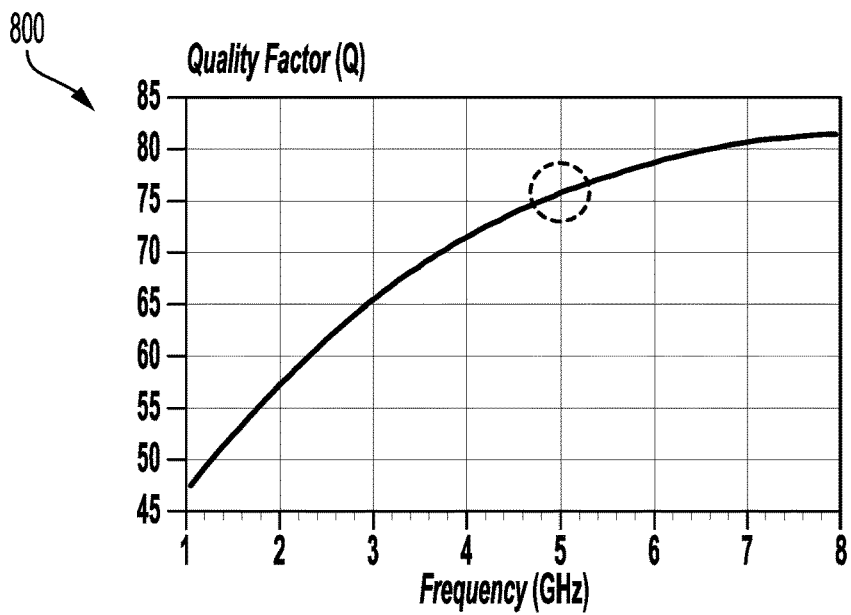
FIGS. 8A-8C illustrate quality (Q)-factor versus frequency graphs of the 3D inductors of FIGS. 4A, 7A, and 7B, having a bundle of micro-through substrate vias, according to aspects of the present disclosure.
Figure 8B:
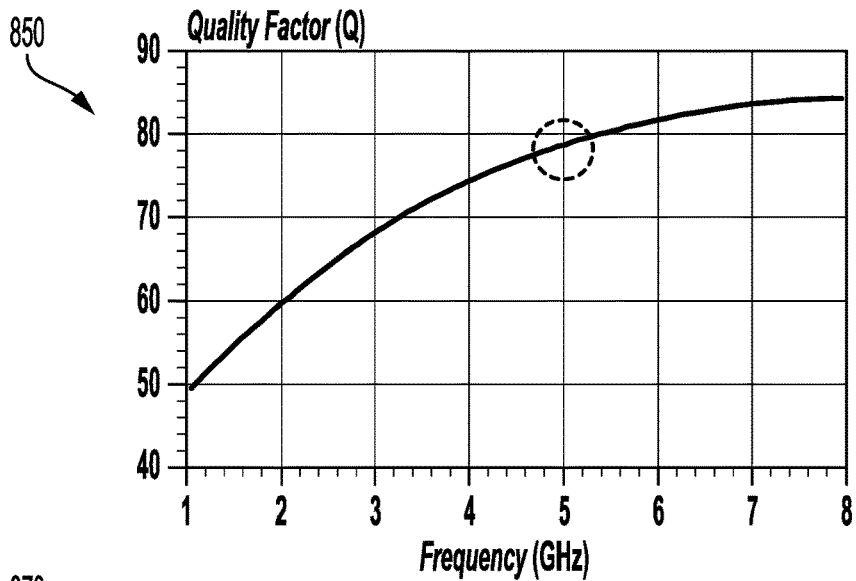
Figure 8C:
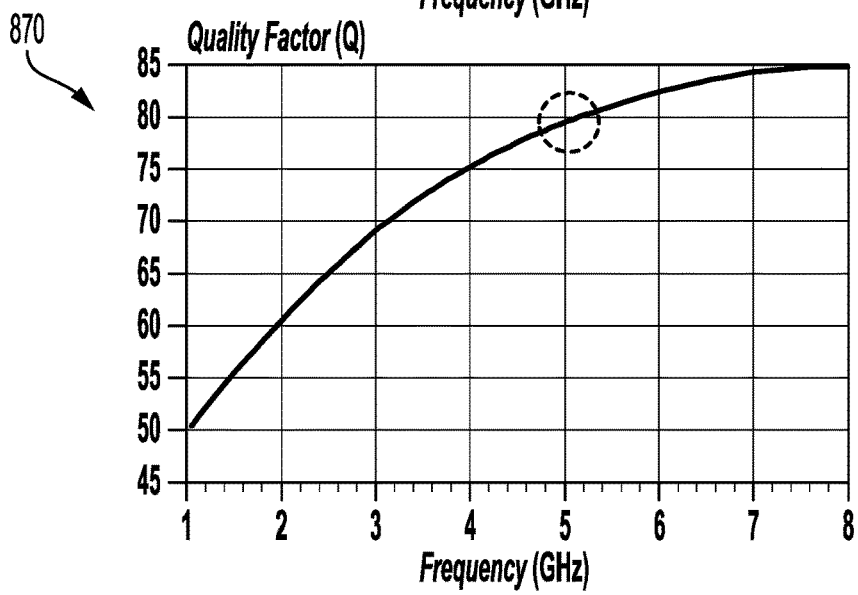

FIGS. 8A-8C illustrate quality factor versus frequency graphs of the 3D inductors of FIGS. 4A, 7A, and 7B having a bundle of micro-through substrate vias (TSVs), according to aspects of the present disclosure. FIG. 8A illustrates a quality (Q)-factor versus frequency graph 800, which shows a target Q-factor of 75 at a 5 gigahertz (GHz) frequency for the 3D inductor 400 of FIG. 4A. FIG. 8B illustrates a Q-factor versus frequency graph 850, which shows a target Q-factor of 78 at the 5 GHz frequency achieved by the 3D inductor 700 of FIG. 7A. FIG. 8C illustrates a Q-factor versus frequency graph 870, which shows a target Q-factor of 80 at the 5 GHz frequency achieved by the 3D inductor 760 of FIG. 7B.

Figure 9:
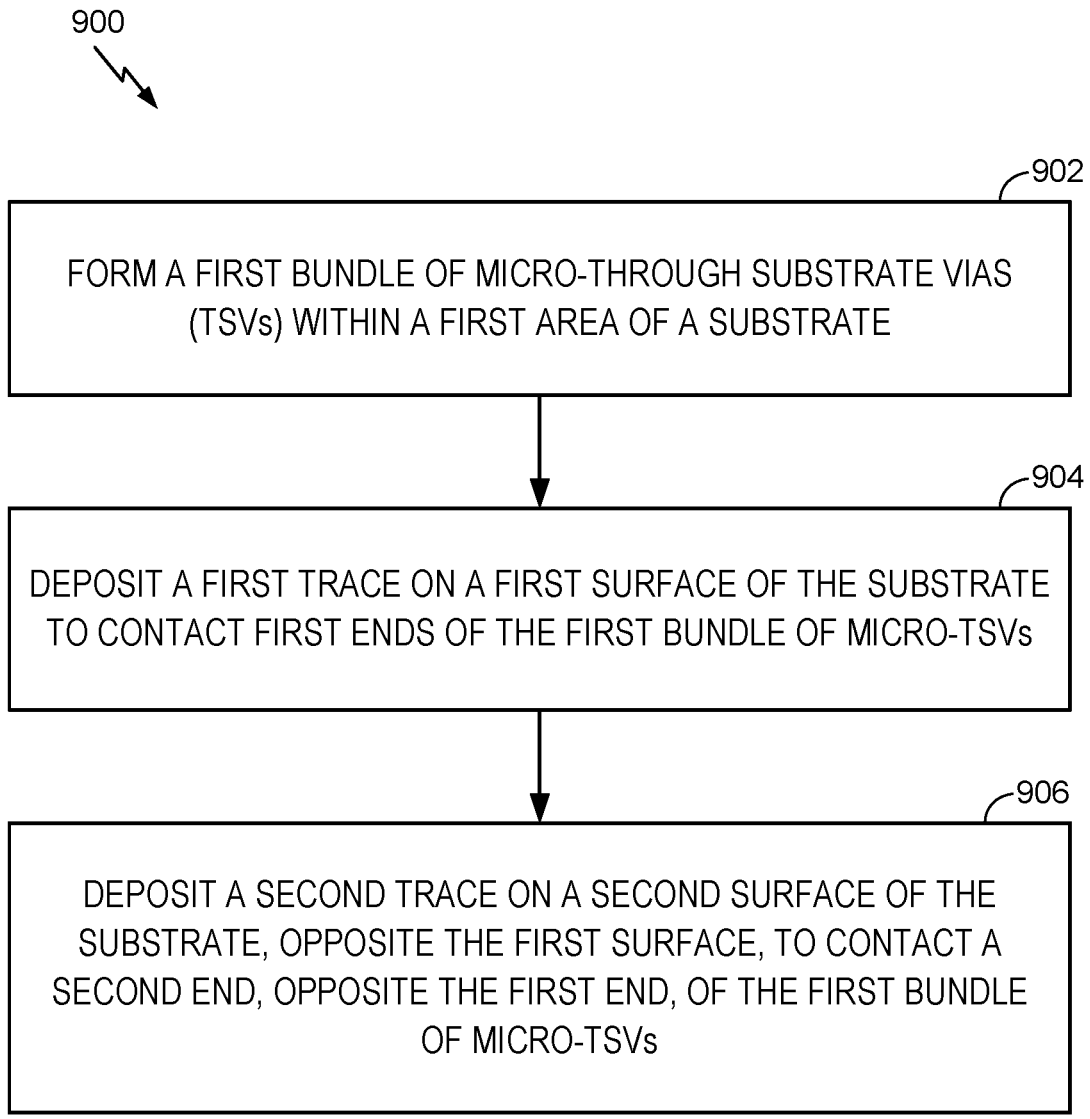
FIG. 9 is a process flow diagram illustrating a method for fabricating a 3D inductor having a bundle of micro-through substrate vias (TSVs), according to aspects of the present disclosure.

FIG. 9 is a process flow diagram illustrating a method for fabricating a three dimensional (3D) inductor having a bundle of micro-through substrate vias (TSVs), according to aspects of the present disclosure. A method 900 begins in block 902, in which a first bundle of micro-through substrate vias (TSVs) is formed within a first area of a substrate. For example, as shown in FIG. 4B, the first bundle of micro-TSVs 420-1 is formed within a form factor of a first macro-TSV opening 440 (e.g., a first area) within the substrate 402. In these aspects of the present disclosure, a Space B between the micro-TSVs of the first bundle of micro-TSVs 420-1 is less than a space between the first macro-TSV opening 440 (e.g., the first area) and a second macro-TSV opening 442 (e.g., a second area) in the substrate 402.

In block 904, a first trace is deposited on a first surface of the substrate to contact first ends of the first bundle of micro-TSVs. For example, as shown in FIG. 4A, the 3D inductor 400 includes a first trace 410 on a first surface 404 of the substrate 402 and contacted to a first end 422 of the bundle of micro-TSVs 420. In block 906, a second trace is deposited on a second surface of the substrate, opposite the first surface, to contact a second end, opposite the first end, of the first bundle of micro-TSVs. For example, as shown in FIG. 4A, The 3D inductor 400 also includes a second trace 412 on a second surface 406, opposite the first surface 404, of the substrate 402 and contacted to a second end 424 of the bundle of micro-TSVs 420.

Aspects of the present disclosure implement 3D solenoid-type inductors using bundles of micro-through substrate vias (TSVs), which may be referred to as bundle substrate vias (BSVs). In these aspects of the present disclosure, the bundle substrate vias are used in place of a single through substrate via to mitigate process-challenges. These process-challenges are mitigated because the large form factor of a single TSV is replaced by the smaller form factor of bundle substrate vias. The bundle substrate vias have a significantly reduced pitch relative to a single TSV (e.g., from 80 µm to <20 µm). The bundle substrate vias improve 3D inductor performance by increasing the Q-factor (e.g., >10% increase of the 3D inductor Q-factor). This Q-factor improvement is achieved due to a tight design rule check (DRC), which may be defined as design rule specifications, such as metal to metal pitch/space to avoid violating a process-capability. In addition, filter insertion-loss is improved (e.g., >0.3 dB of insertion-loss) when comparing 2D inductor implementations versus 3D inductor implementation.

Figure 10:
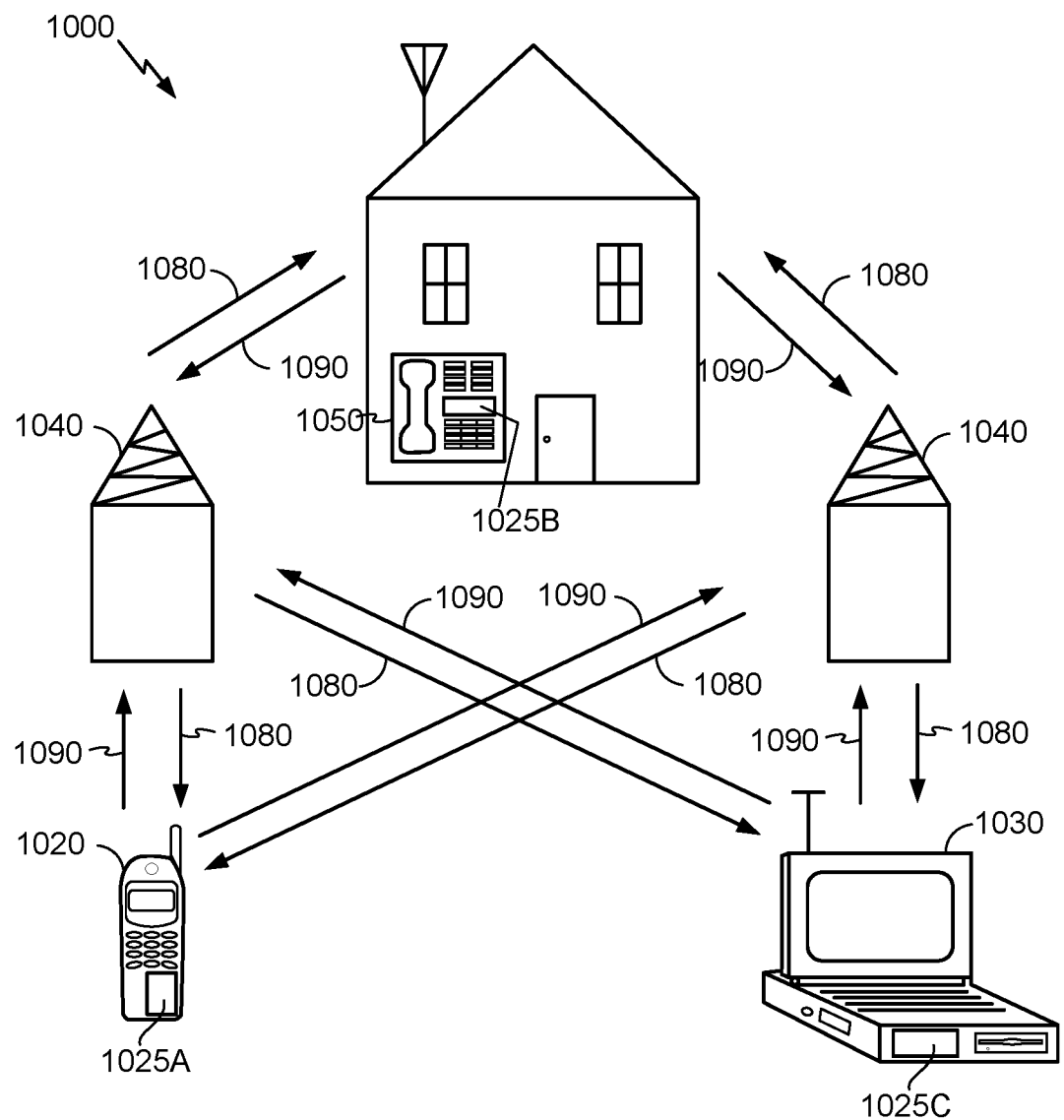
FIG. 10 is a block diagram showing an exemplary wireless communications system in which a configuration of the present disclosure may be advantageously employed.

FIG. 10 is a block diagram showing an exemplary wireless communications system 1000 in which an aspect of the disclosure may be advantageously employed. For purposes of illustration, FIG. 10 shows three remote units 1020, 1030, and 1050 and two base stations 1040. It will be recognized that wireless communications systems may have many more remote units and base stations. Remote units 1020, 1030, and 1050 include integrated circuit (IC) devices 1025A, 1025C, and 1025B that include the disclosed 3D inductor having a bundle of micro-TSVs. It will be recognized that other devices may also include the disclosed 3D inductors, such as the base stations, switching devices, and network equipment. FIG. 10 shows forward link signals 1080 from the base station 1040 to the remote units 1020, 1030, and 1050, and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 10 illustrates remote units according to the aspects of the present disclosure, the present disclosure is not limited to these exemplary illustrated units. Aspects of the present disclosure may be suitably employed in many devices, which include the disclosed 3D inductors.

Figure 11:
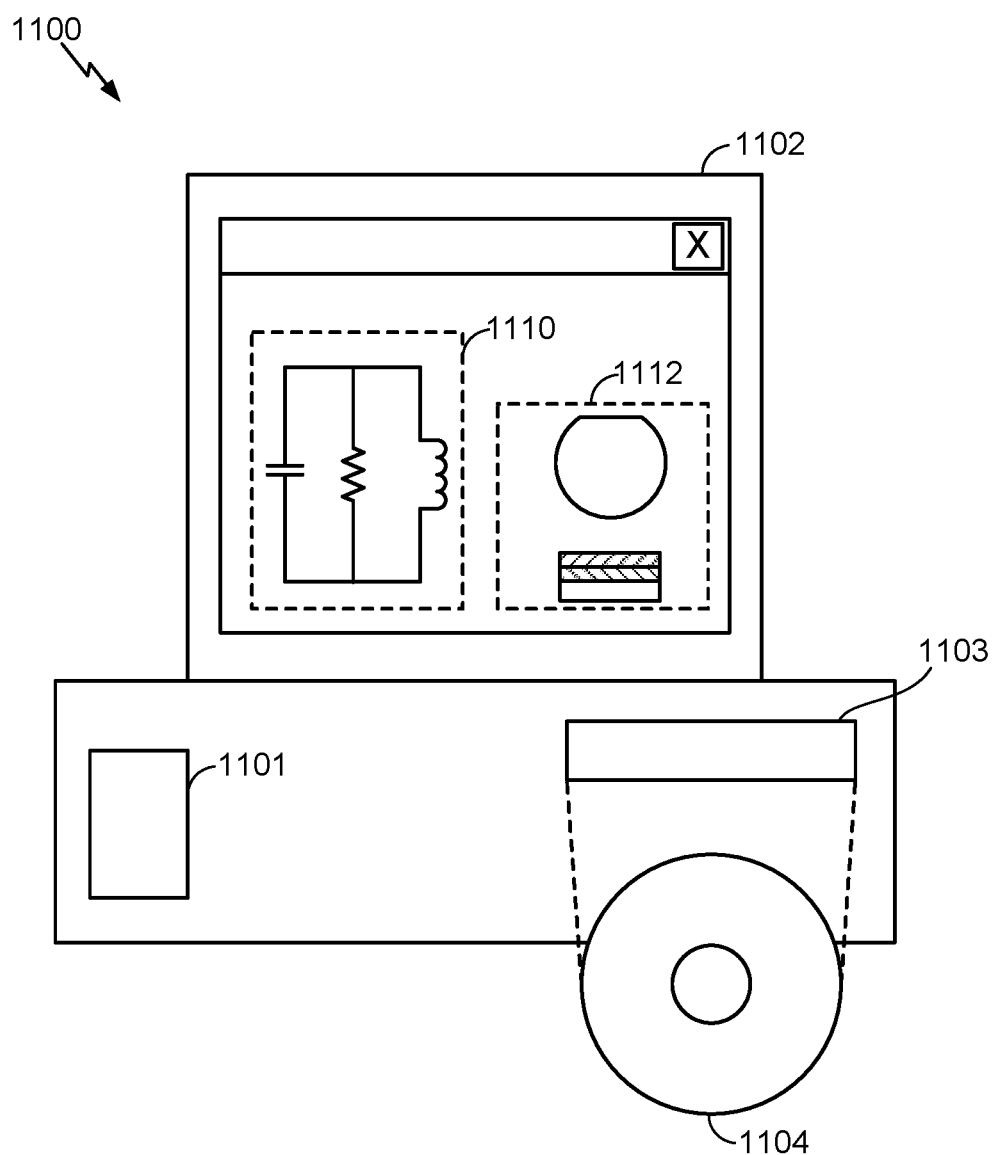
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the 3D inductor disclosed above. A design workstation 1100 includes a hard disk 1101 containing operating system software, support files, and design software such as Cadence or OrCAD. The design workstation 1100 also includes a display 1102 to facilitate design of a circuit 1110 or a radio frequency (RF) component 1112 such as a 3D inductor. A storage medium 1104 is provided for tangibly storing the design of the circuit 1110 or the RF component 1112 (e.g., the 3D inductor having a bundle of micro-TSVs). The design of the circuit 1110 or the RF component 1112 may be stored on the storage medium 1104 in a file format such as GDSII or GERBER. The storage medium 1104 may be a compact disc read-only memory (CD-ROM), digital versatile disc (DVD), hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit 1110 or the radio frequency (RF) component 1112 by decreasing the number of processes for designing semiconductor wafers.

Implementation examples are described in the following numbered clauses:

1. A three dimensional (3D) inductor, comprising:
   a first plurality of micro-through substrate vias (TSVs) within a first area of a substrate;
   a first trace on a first surface of the substrate, coupled to a first end of the first plurality of micro-TSVs; and a second trace on a second surface of the substrate, opposite the first surface, coupled to a second end, opposite the first end, of the first plurality of micro-TSVs.

2. The 3D inductor of clause 1, in which a space between two micro-TSV of the first plurality of micro-TSVs is less than a space between the first area of the substrate corresponding to a form factor of a macro-TSV and a second area of the substrate corresponding to the form factor of the macro-TSV.

3. The 3D inductor of any of clauses 1-2, in which the first trace comprises a first multiple strip-line trace.

4. The 3D inductor of any of clauses 1-3, in which the second trace comprises a second multiple strip-line trace.

5. The 3D inductor of any of clauses 1-2, in which the first trace comprises a first multiple strip-line trace and the second trace comprises a second multiple strip-line trace.

6. The 3D inductor of any of clauses 1-2, in which the first trace comprises a single strip-line trace and the second trace comprises a multiple strip-line trace.

7. The 3D inductor of any of clauses 1-2, in which the first trace comprises a multiple strip-line trace and the second trace comprises a single strip-line trace.

8. The 3D inductor of any of clauses 1-7, in which the 3D inductor is integrated in an integrated passive device (IPD).

9. The 3D inductor of clause 8, in which the IPD is integrated in an IPD filter die.

10. The 3D inductor of clause 9, in which the IPD filter die is integrated in a radio frequency front-end (RFFE) module.

11. A method for fabricating a three dimensional (3D) inductor, the method comprising:

forming a first plurality of micro-through substrate vias (TSVs) within a first macro-TSV opening within a first area of a substrate;

depositing a first trace on a first surface of the substrate to contact a first end of the first plurality of micro-TSVs; and depositing a second trace on a second surface of the substrate, opposite the first surface, to contact a second end, opposite the first end of the first plurality of micro-TSVs.

12. The method of clause 11, in which forming the first plurality of micro-TSVs comprises uniformly spacing the first plurality of micro-TSVs, in which a space between two micro-TSVs of the first plurality of micro-TSVs is less than a space between the first area of the substrate corresponding to a form factor of a macro-TSV and a second area of the substrate corresponding to the form factor of the macro-TSV.

13. The method of any of clauses 11-12, in which depositing the first trace comprises depositing a first multiple strip-line trace on the first surface of the substrate.

14. The method of any of clauses 11-13, in which deposing the second trace comprises depositing a second multiple strip-line trace on the second surface of the substrate.

15. The method of any of clauses 11-12,
in which depositing the first trace comprises depositing a first multiple strip-line trace on the first surface of the substrate; and
in which deposing the second trace comprises depositing a second multiple strip-line trace on the second surface of the substrate.

16. The method of any of clauses 11-12,
in which depositing the first trace comprises depositing a single strip-line trace on the first surface of the substrate; and
in which deposing the second trace comprises depositing a multiple strip-line trace on the second surface of the substrate.

17. The method of any of clauses 11-12,
in which depositing the first trace comprises depositing a multiple strip-line trace on the first surface of the substrate; and
in which deposing the second trace comprises depositing a single strip-line trace on the second surface of the substrate.

18. The method of any of clauses 11-17, further comprising integrating the 3D inductor in an integrated passive device (IPD).

19. The method of clause 18, further comprising integrating the IPD in an IPD filter die.

20. The method of clause 19, further comprising integrating the IPD filter die in a radio frequency front-end (RFFE) module.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function, or achieve substantially the same result as the corresponding configurations described herein, may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in random access memory (RAM), flash memory, read-only memory (ROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include random access memory (RAM), read-only memory (ROM), electrically erasable programmable read-only memory (EEPROM), compact disc read-only memory (CD-ROM) or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc, where disks usually reproduce data magnetically, while discs reproduce data optically with lasers. Combinations of the above should also be included within the scope of computer-readable media.

The previous description of the present disclosure is provided to enable any person skilled in the art to make or use the disclosure. Various modifications to the present disclosure will be readily apparent to those skilled in the art, and the generic principles defined herein may be applied to other variations without departing from the spirit or scope of the disclosure. Thus, the present disclosure is not intended to be limited to the examples and designs described herein but is to be accorded the widest scope consistent with the principles and novel features disclosed herein.

What is claimed is:

1. A three dimensional (3D) inductor, comprising:
   a first plurality of micro-through substrate vias (TSVs) within a first area of a substrate, each micro-TSV having a diameter of less than twenty micrometers, the first plurality of micro-TSVs arranged in multiple columns and multiple rows, the first area of the substrate corresponding to a macro-TSV opening of the substrate having a diameter of more than eighty micrometers;
   a first trace on a first surface of the substrate, coupled to a first end of the first plurality of micro-TSVs; and
   a second trace on a second surface of the substrate, opposite the first surface, coupled to a second end, opposite the first end, of the first plurality of micro-TSVs.

2. The 3D inductor of claim 1, in which a space between two micro-TSVs of the first plurality of micro-TSVs is less than a space between the first area of the substrate corresponding to a form factor of a macro-TSV and a second area of the substrate corresponding to the form factor of the macro-TSV.

3. The 3D inductor of claim 1, in which the 3D inductor is integrated in an integrated passive device (IPD).

4. The 3D inductor of claim 3, in which the IPD is integrated in an IPD filter die.

5. The 3D inductor of claim 4, in which the IPD filter die is integrated in a radio frequency front-end (RFFE) module.

6. A method for fabricating a three dimensional (3D) inductor, the method comprising:
   forming a first plurality of micro-through substrate vias (TSVs) within a first area of a substrate, each micro-TSV having a diameter of less than twenty micrometers, the first plurality of micro-TSVs arranged in multiple columns and multiple rows, the first area of the substrate corresponding to a macro-TSV opening of the substrate;
   depositing a first trace on a first surface of the substrate to contact a first end of the first plurality of micro-TSVs; and
   depositing a second trace on a second surface of the substrate, opposite the first surface, to contact a second end, opposite the first end, of the first plurality of micro-TSVs.

7. The method of claim 6, in which forming the first plurality of micro-TSVs comprises uniformly spacing the first plurality of micro-TSVs, in which a space between two micro-TSVs of the first plurality of micro-TSVs is less than a space between the first area of the substrate corresponding to a form factor of a macro-TSV and a second area of the substrate corresponding to the form factor of the macro-TSV.

8. The method of claim 6, further comprising integrating the 3D inductor in an integrated passive device (IPD).

9. The method of claim 8, further comprising integrating the IPD in an IPD filter die.

10. The method of claim 9, further comprising integrating the IPD filter die in a radio frequency front-end (RFFE) module.

* * * * *